(12) United States Patent
Liu et al.

(10) Patent No.: US 10,669,625 B2
(45) Date of Patent: Jun. 2, 2020

(54) PUMPING LINER FOR CHEMICAL VAPOR DEPOSITION

(71) Applicant: Taiwan Semiconductor Manufacturing Company Limited, Hsin-Chu (TW)

(72) Inventors: Cheng-Hsiung Liu, Zhunan Township (TW); Chun-Hao Hsu, New Taipei (TW); Yu-Yun Peng, Hsinchu (TW); Chih-Yuan Yao, Hsinchu (TW); Chia-I Shen, Hsinchu (TW); Keng-Chu Lin, Ping-Tung (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 683 days.

(21) Appl. No.: 14/198,651

(22) Filed: Mar. 6, 2014

(65) Prior Publication Data

US 2014/0261176 A1 Sep. 18, 2014

Related U.S. Application Data

(60) Provisional application No. 61/800,167, filed on Mar. 15, 2013.

(51) Int. Cl.
*C23C 16/00* (2006.01)
*C23C 16/44* (2006.01)
*C23C 16/455* (2006.01)

(52) U.S. Cl.
CPC .... *C23C 16/4412* (2013.01); *C23C 16/45591* (2013.01); *Y10T 428/218* (2015.01)

(58) Field of Classification Search
CPC .................................................. C23C 16/4412
USPC .......................................................... 118/715
See application file for complete search history.

(56) References Cited

U.S. PATENT DOCUMENTS

| 5,735,960 | A  | * | 4/1998 | Sandhu  | C23C 16/4412 |
|           |    |   |        |         | 118/715      |
| 6,113,732 | A  | * | 9/2000 | Yoshida | C23C 16/4412 |
|           |    |   |        |         | 118/723 R    |
| 6,120,605 | A  | * | 9/2000 | Sato    | C23C 16/4401 |
|           |    |   |        |         | 118/715      |
| 6,224,724 | B1 | * | 5/2001 | Licata  | C23C 14/022  |
|           |    |   |        |         | 204/298.06   |
| 6,402,847 | B1 | * | 6/2002 | Takagi  | C23C 16/4405 |
|           |    |   |        |         | 118/715      |

(Continued)

*Primary Examiner* — Keath T Chen
(74) *Attorney, Agent, or Firm* — Cooper Legal Group, LLC

(57) ABSTRACT

One or more pumping liners are provided for use in chemical vapor deposition (CVD). A pumping liner encircles a deposition chamber within which a wafer is placed and into which a precursor is introduced to form a thin film on a surface of the wafer. The pumping liner regulates a rate and uniformity at which a gas is removed from the deposition chamber, which in turn affects a duration or degree to which different portions of the wafer are exposed to the precursor. Controlling exposure of the wafer to the precursor promotes uniformity of the film formed on the wafer as well an ability to regulate the thickness of the film formed on the wafer. In an embodiment, a pumping liner has at least one of relatively small liner apertures, an increased number of liner apertures or a non-uniform distribution of liner apertures within a body of the pumping liner.

20 Claims, 6 Drawing Sheets

(56) References Cited

U.S. PATENT DOCUMENTS

| | | | | |
|---|---|---|---|---|
| 6,821,378 B1* | 11/2004 | Daugherty | ........ | H01J 37/32449 |
| | | | | 118/715 |
| 6,963,043 B2* | 11/2005 | Fink | .................. | H01J 37/32642 |
| | | | | 118/723 R |
| 2002/0045362 A1* | 4/2002 | Yang | ..................... | C23C 16/345 |
| | | | | 438/791 |
| 2002/0134308 A1* | 9/2002 | Amano | ............... | C23C 16/4412 |
| | | | | 118/715 |
| 2003/0094135 A1* | 5/2003 | Komiya | .............. | C23C 16/4412 |
| | | | | 118/715 |
| 2005/0170668 A1* | 8/2005 | Park | ..................... | C23C 16/4412 |
| | | | | 438/789 |
| 2006/0151114 A1* | 7/2006 | Fink | .................... | H01J 37/3244 |
| | | | | 156/345.29 |
| 2007/0022959 A1* | 2/2007 | Bercaw | ............... | C23C 16/4401 |
| | | | | 118/728 |
| 2007/0281106 A1* | 12/2007 | Lubomirsky | ......... | C23C 16/401 |
| | | | | 427/569 |
| 2010/0080904 A1* | 4/2010 | Merry | ............... | C23C 16/45502 |
| | | | | 427/255.15 |

* cited by examiner

PUMPING LINER FOR CHEMICAL VAPOR DEPOSITION

BACKGROUND

The present disclosure relates to chemical vapor deposition (CVD), wherein a wafer is positioned within a deposition chamber defined within a CVD assembly. A precursor is introduced into the deposition chamber to expose a surface of the wafer to the precursor and thereby form a material on the surface of the wafer, such as in the form of a thin film.

DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
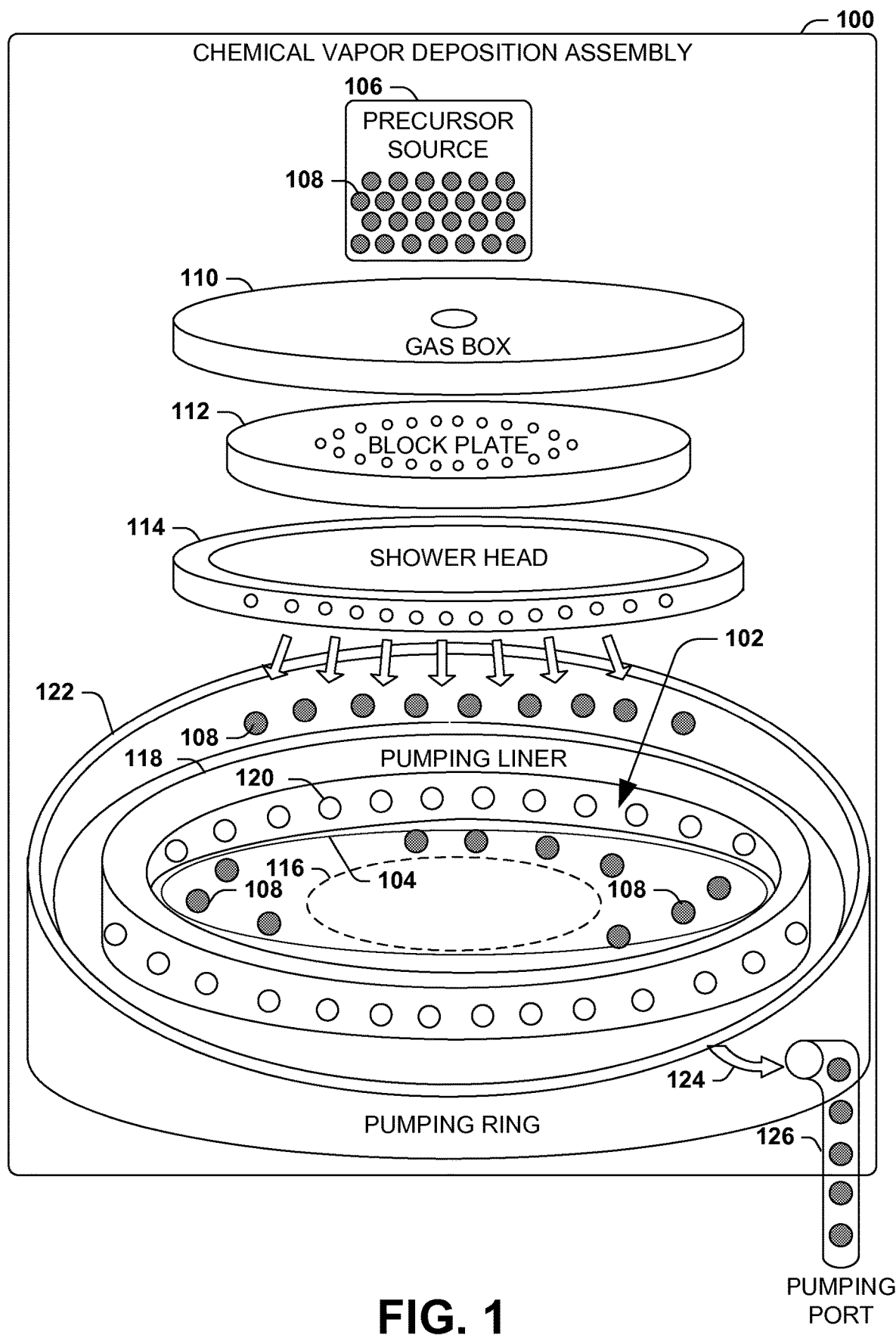
FIG. 1 is an illustration of a chemical vapor deposition (CVD) assembly.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In chemical vapor deposition (CVD), a material is deposited on a surface of a wafer, such as in the form of a thin film. To form the thin film on the wafer, the wafer is placed within a deposition chamber of a CVD assembly and a precursor is introduced into the deposition chamber. The precursor reacts with the surface of the wafer to form the thin film thereon. The reaction produces a gaseous byproduct which is exhausted or removed from the deposition chamber through, among other things, a pumping liner and a pumping port. Portions of the precursor that do not react with the surface of the wafer "unreacted precursor" are also exhausted through the pumping liner and pumping port. For simplicity, the gaseous byproduct and the unreacted precursor are at times collectively referred to as a gas or the like herein. The rate at which the gas is removed from the deposition chamber affects, among other things, how long the surface of the wafer is exposed to the precursor which in turn affects the thickness of the film formed on the surface of the wafer. Moreover, the uniformity at which the gas is removed from the deposition chamber affects the uniformity of the film formed on the surface of the wafer. Thus, where the gas is removed at a first rate from a first region of the deposition chamber and is removed at a second rate from a second region of the deposition chamber, the film formed on a first area of the wafer corresponding to the first region has a first thickness that is different than a second thickness of the film formed on a second area of the wafer corresponding to the second region.

According to some embodiment, a pumping liner is provided that facilitates a uniform and controlled removal of gas from the deposition chamber, thus improving the uniformity and ability to control the thickness of the film formed on the surface of the wafer. In an embodiment, a pumping liner has an increased number of liner apertures, such as about 60 liner apertures, defined within and penetrating through an annular body of the pumping liner. The increased number of liner apertures results in greater uniformity or consistency in the exposure of the wafer to the precursor. In an embodiment, respective liner apertures defined within and penetrating through the annular body of the pumping liner have a radius of about 4.5 millimeters. In an embodiment, a sum of aperture areas of the liner apertures has a cumulative aperture area of less than about 1,200 square millimeters. The pumping liner promotes the formation of a thin film having a desired thickness where the thickness of the thin film is substantially uniform across the surface of the wafer. Semiconductor devices generated using such films operate in a more predictable and desired manner.

FIG. 1 is an exploded view of a chemical vapor deposition (CVD) assembly 100, where a wafer 104 that is to be exposed to a vaporous precursor 108 is positioned within a deposition chamber 102 defined within the CVD assembly. While not drawn to scale, components of the CVD assembly 100 are understood to fit together when not in an exploded state, to operate as described herein. The CVD assembly includes a gas box 110, below which is positioned block plate 112 that is configured to disperse the precursor 108 that is received from a precursor source 106 through the gas box 110. The CVD assembly 100 includes a shower head 114 configured to introduce the precursor 108 into the deposition chamber 102. The CVD assembly 100 includes a stage 116 which places the wafer 104 within the deposition chamber 102. The stage 116 is illustrated in phantom because the wafer 104 covers the stage 116. A pumping liner 118 of the CVD assembly encircles or surrounds the deposition chamber 102 and thus the wafer 104 disposed therein. The pumping liner 118 has an annular body where an array of liner apertures are defined within and penetrate through the annular body. The array of liner apertures include 48 liner apertures 120 respectively having a radius of about 6.25 millimeters. A sum of aperture areas of the liner apertures 120 has a cumulative aperture area of about 1,461 square millimeters. Gas from a CVD process thus has about 1,461 square millimeters through which to exit the deposition chamber 102. A pumping ring 122 of the CVD assembly 100 encircles or surrounds the pumping liner 118 such that a pumping passage is defined between the pumping ring 122 and the pumping liner 118. For purposes of illustration, at least one of the pumping ring 118 is tilted forward or a front portion of the pumping ring 118 is cut away or removed so that the pumping liner 118, which is surrounded by the pumping ring 122, is visible. Gas from a CVD process thus exits the deposition chamber 102 through the liner apertures 120 in the pumping liner 118 and enters the pumping passage. The gas then exits pumping passage through a pumping port 126 coupled to the pumping ring 122. The gas is evacuated from the pumping passage by a vacuum 124 at the pumping port 126, or at least a pressure differential between the pumping port 126 and the pumping passage.

The flow of the gas of out of the deposition chamber 102 affects how long the wafer 104 is exposed to the precursor which affects a thickness and uniformity of the thin film formed on a surface of the wafer 104. It has been observed, however, that an undesirable variance in the exposure of the wafer 104 to the precursor 108 occurs with the CVD assembly 100. The exposure is inconsistent due to the number and sizes of the liner apertures 120, particularly given the proximity of the pumping port 126 to some of the apertures but not others. The vacuum 124 or pressure differential at the pumping port 126 exerts a different force upon liner apertures 120, or rather upon gas drawn therethrough, that are close to the pumping port as compared to liner apertures 120, or rather gas drawn there-through, that are farther away from the pumping port 126. These differences in force result in different flow rates of gas through the liner apertures 120. A first flow rate of gas out of the deposition chamber 102 through a first liner aperture 120 near the pumping port 126 is thus different than a second flow rate of gas out of the deposition chamber 102 through a second liner aperture 120 that is farther away from the pumping port 126. The different flow rates of gas out of the deposition chamber affect how long different areas of the wafer are exposed to the precursor and thus how much film is formed at those areas. Thus, where the gas is removed at a first rate from a first region of the deposition chamber and is removed at a second rate from a second region of the deposition chamber, the film formed on a first area of the wafer corresponding to the first region has a first thickness that is different than a second thickness of the film formed on a second area of the wafer corresponding to the second region. As a result, a variation or gradient of film thickness is produced across the surface of the wafer 104.

Figure 2A:
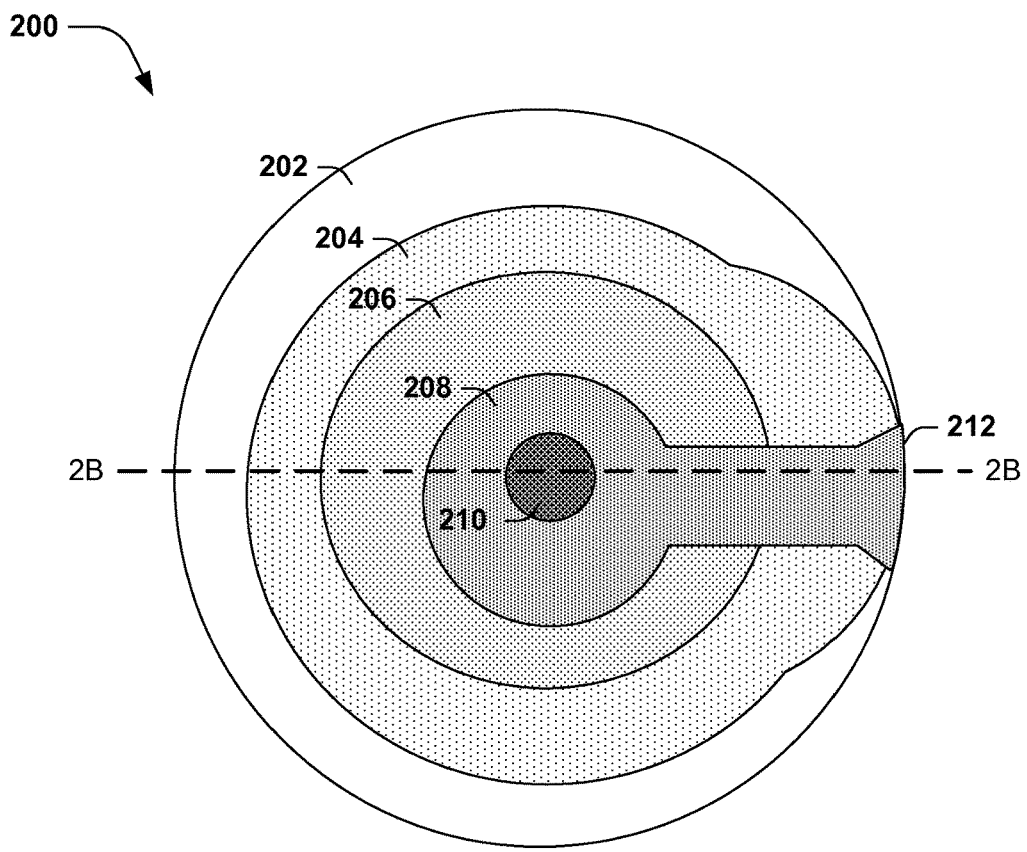
FIG. 2A is a contour plot of film thickness on a wafer using the CVD assembly of FIG. 1.
Figure 2B:
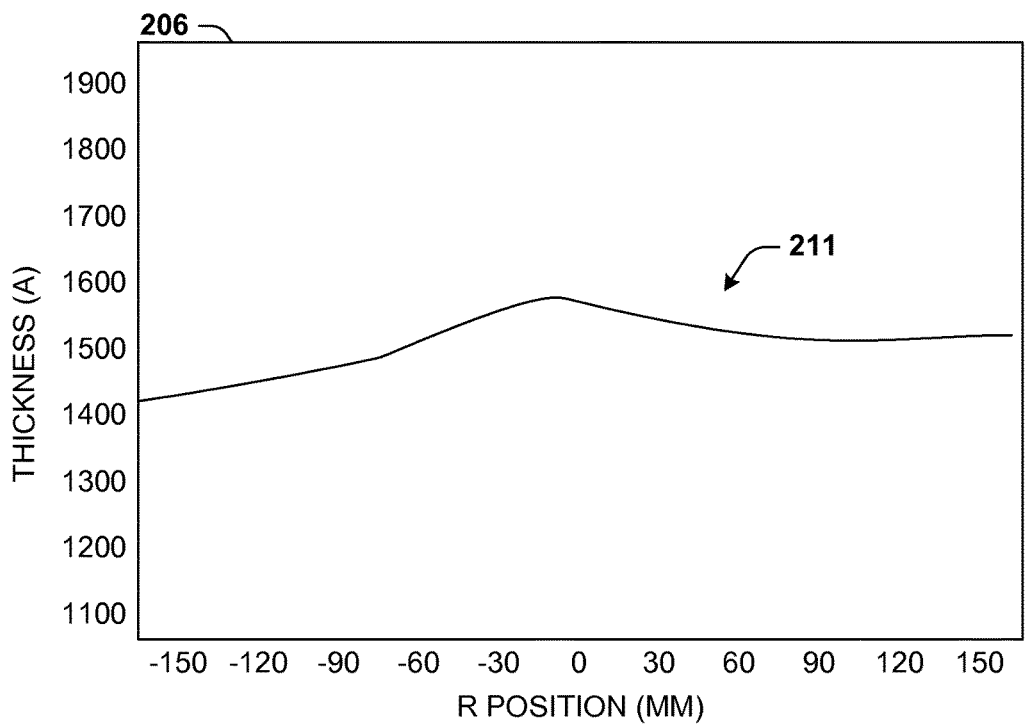
FIG. 2B is a profile plot of film thickness on a wafer using the CVD assembly of FIG. 1.

FIG. 2A is a contour plot 200 of an approximation of experimental observations of variance in deposited film thickness, resulting in a gradient of deposit thickness across the surface of the wafer 104, where the pumping port 126 was proximate location 212 of the wafer 104. A first area 210 near the center of the contour plot 200 has a higher observed deposit thickness than a second area 208 surrounding the center. The second area 208, extending out to location 212, has relatively greater deposit thickness than a third area 206 surrounding the second area 208. The third area 206 has a relatively greater thickness than a fourth area 204 surrounding the third area 206, and a fifth area 202 at the periphery of the observed region of the surface of the wafer 104 has a still lower deposited film thickness. FIG. 2B is a profile plot 206 with a curve 211 illustrating the thickness of deposited film along line 2B-2B in FIG. 2A. Moving from left to right across the wafer 104, the film is the least thick at the left edge of the wafer, has a peak thickness near the center of the wafer and then has a relatively uniform thickness from the center of the wafer to the right edge of the wafer 104.

In view of these observations, one or more pumping liners are provided for use in a CVD arrangement to produce a more uniform film thickness across a wafer, such as by promoting at least one of a more uniform or constrained gas flow out of a deposition chamber of the CVD arrangement. According to some embodiments, a pumping liner has an annular body with an array of liner apertures defined within and penetrating through the annular body, where a radius of respective liner apertures is less than about 4.5 millimeters. According to some embodiments, the array of liner apertures comprises at least about 60 liner apertures. According to some embodiments, a sum of aperture areas of the liner apertures, of the array of liner apertures, has a cumulative aperture area of less than about 1,200 square millimeters.

Figure 3:
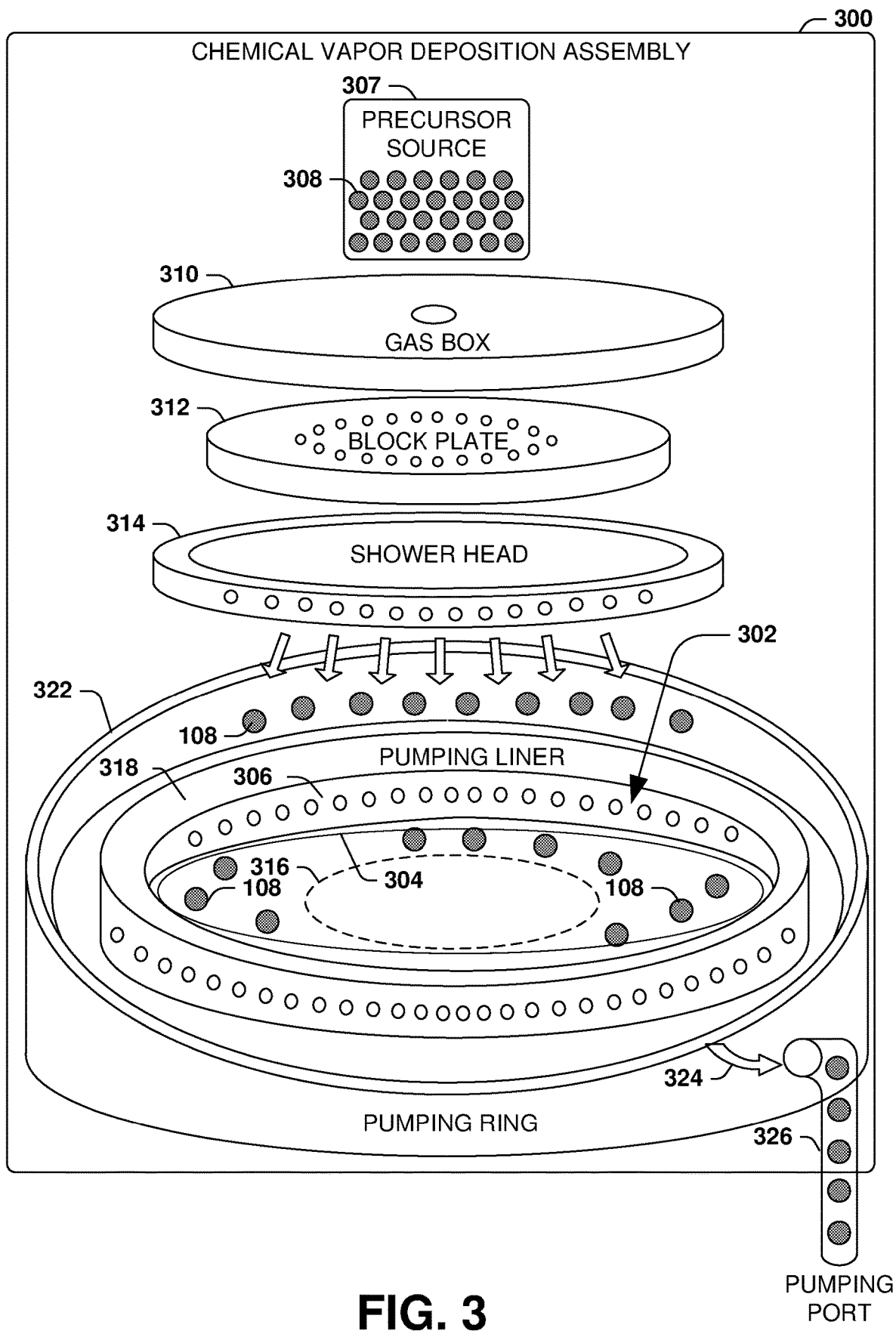
FIG. 3 is an illustration of a CVD assembly, in accordance with some embodiments.

FIG. 3 is an exploded view of a chemical vapor deposition (CVD) assembly 300 including an improved pumping liner 318, according to some embodiments. While not drawn to scale, components of the CVD assembly 100 are understood to fit together when not in an exploded state, to operate as described herein. With the pumping liner 318, a substantially uniform thin film having a desired thickness is formed on a wafer 304 disposed within a deposition chamber 302 defined within the CVD assembly 300. The pumping liner is generally dimensioned so as to correspond to that of the wafer 304 so that there is little to no space or gap between the wafer 304 and the pumping liner 318. Thus when the wafer is positioned within the deposition chamber 302, the outer edge of the wafer 304 is proximate or abuts an inner sidewall surface of the pumping liner. In accordance with some embodiments, the thin film formed on the wafer is usable as at least one of a low dielectric constant layer, a silicon oxide layer, a silicon nitride layer or one or more other layers used in semiconductor fabrication.

The CVD assembly includes a gas box 310 positioned above a block plate 312 that is configured to disperse a precursor 308 that is received from a precursor source 307 through the gas box 310. The CVD assembly 300 includes a shower head 314 configured to introduce the precursor 308 into the deposition chamber 302. The CVD assembly 300 includes a stage 316 which places the wafer 304 within the deposition chamber 302. The stage 316 is illustrated in phantom because the wafer 304 covers the stage 316. A pumping liner 318 of the CVD assembly encircles the deposition chamber 302 and thus the wafer 304 disposed therein. The pumping liner 318 has an annular body where an array of liner apertures are defined within and penetrate through the annular body. According to some embodiments, the array of liner apertures comprises at least about 60 liner apertures. According to some embodiments, a radius of respective liner apertures, of the array of liner apertures, is less than about 4.5 millimeters. According to some embodiments, a sum of aperture areas of the liner apertures, of the array of liner apertures, has a cumulative aperture area of less than about 1,200 square millimeters. Gas from a CVD process thus has about 1,200 square millimeters through which to exit the deposition chamber 302. Notably, this area is less than the area described with respect to FIG. 1 and thus the flow rate of gas exiting the deposition chamber 302 is constrained relative to that exiting the deposition chamber 102 of FIG. 1. This constrained flow rate promotes a more uniform exposure of the wafer to the precursor, which produces a more uniform thin film across the surface of the wafer. A pumping ring 322 of the CVD assembly 300 surrounds the pumping liner 318 such that a pumping passage is defined between the pumping ring 322 and the pumping liner 318. For purposes of illustration, at least one of the pumping ring 318 is tilted forward or a front portion of the pumping ring 318 is cut away or removed so that the pumping liner 318, which is surrounded by the pumping ring 322, is visible. Gas from a CVD process thus exits the deposition chamber 302 through the liner apertures 306 in the pumping liner 318 and enters the pumping passage. The gas then exits pumping passage through a pumping port 326 couple d to the pumping ring 322. The gas is evacuated from the pumping passage by a vacuum 324 at the pumping port 326, or at least a pressure differential between the pumping port 326 and the pumping passage. According to some embodiments, given that the flow rate of gas exiting the deposition chamber 302 is constrained, the amount of time or degree to which different areas of the surface of the wafer 304 are exposed to the precursor 308 is more uniform across the wafer relative to the scenario described with respect to FIG. 1. According to some embodiments, the constrained flow rate of gas exiting the deposition chamber 302 serves to inhibit an amount or rate of precursor injected into the deposition chamber 302 from the precursor source 307. In addition to making more efficient use of the precursor, this reduced flow of precursor from the precursor source 307 also promotes film uniformity on the surface of the wafer 304.

Figure 4A:
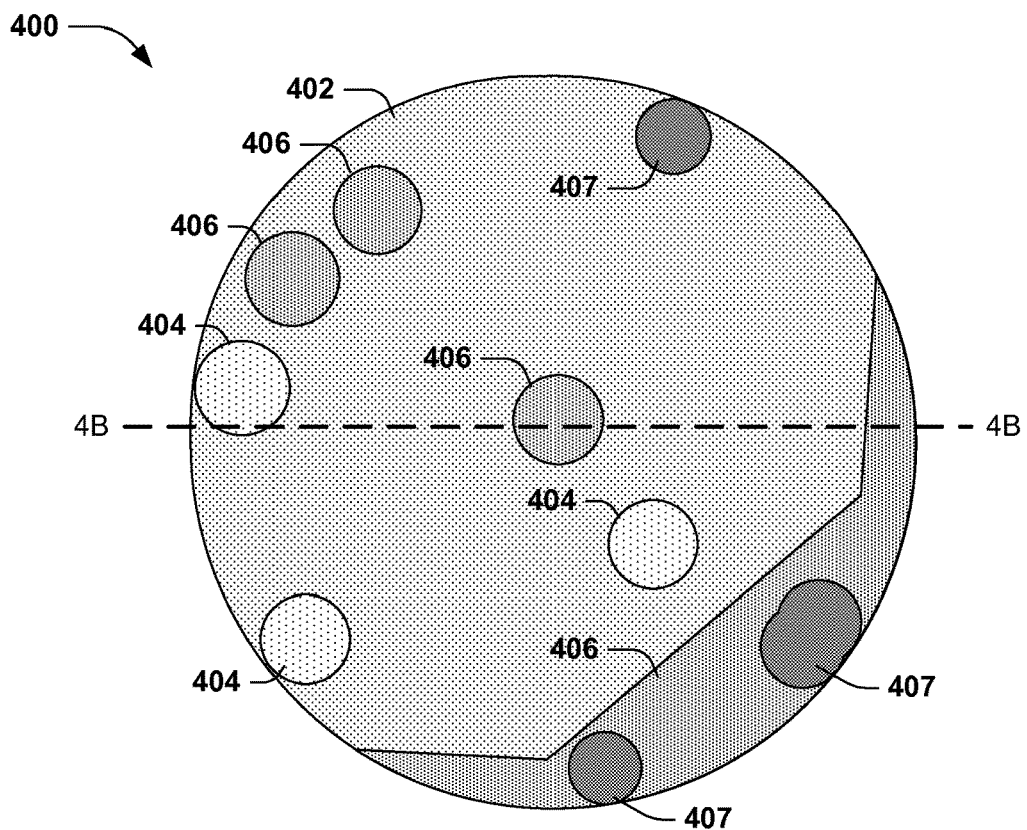
FIG. 4A is a contour plot of film thickness on a wafer using the CVD assembly of FIG. 3, in accordance with some embodiments.
Figure 4B:
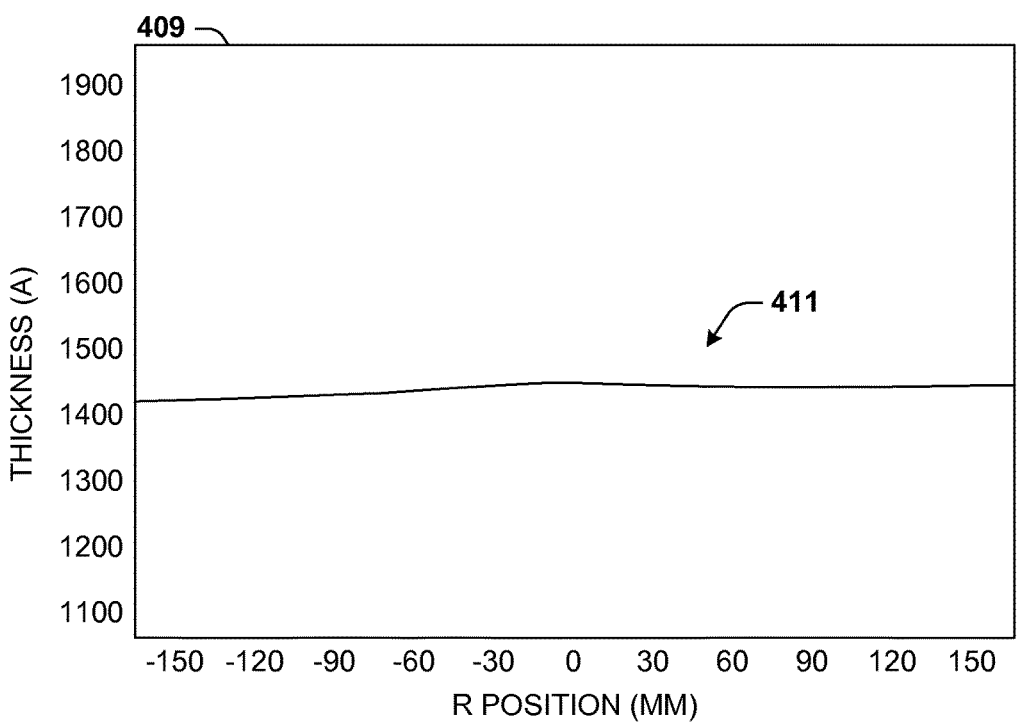
FIG. 4B is a profile plot of film thickness on a wafer using the CVD assembly of FIG. 3, in accordance with some embodiments.

FIG. 4A is a contour plot 400 of an approximation of experimental observations of film thickness in accordance with the techniques presented herein. In comparison with the contour plot 200 of FIG. 2A, the variance in the thickness of the film deposition across the wafer 304 in the contour plot 400 of FIG. 4 is significantly reduced, presenting a relatively consistent thickness across a significant area 402 of the surface of the wafer 304 with a few areas 404 of modestly less deposit thickness, a few areas 406 of modestly greater deposit thickness and a few areas 407 of slightly greater deposit thickness. While the contour plot 400 indicates that the center of the wafer 104 is still slightly increased with respect to the edges, a significant reduction the thickness gradient is observed. Additionally, while the contour plot 200 of FIG. 2A has a relatively significant contrast in deposit thickness around the edge of the wafer, the contour plot 400 of FIG. 4A has a lower-contrast and more gradual variance around the edge of the wafer regardless of the location of the pumping port. FIG. 4B is a profile plot 409 with a curve 411 illustrating the thickness of deposited film along line 4B-4B in FIG. 4A. Moving from left to right across the wafer 304, the film is only slightly more thick at the center and right edge of the wafer 304. According to some embodiments, a maximum change in thickness from one area of the wafer 304, such as at area 404, to another area of the wafer 304, such as at area 407, is about 60 angstroms. This is in contrast to a maximum change in thickness from one area of the wafer 104, such as at area 202, to another area of the wafer 104, such as at area 210, of about 120 angstroms for the scenario depicted with respect to FIGS. 1, 2A and 2B.

Figure 5:
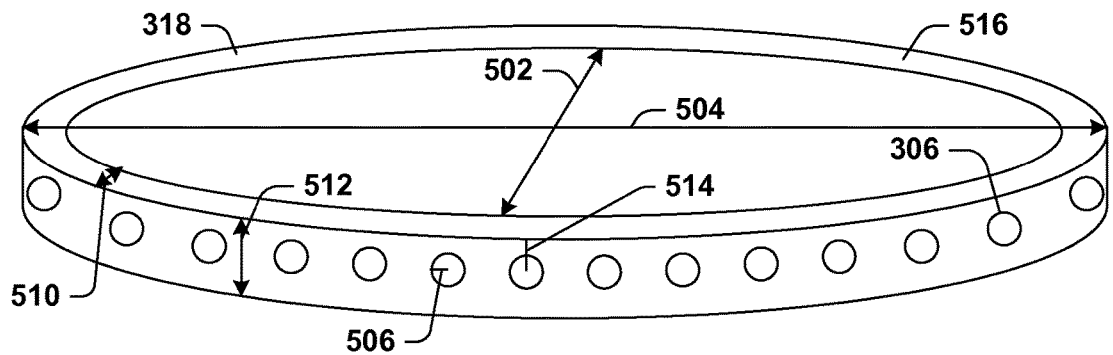
FIG. 5 is an illustration of a pumping liner having a set of dimensions, in accordance with some embodiments.
Figure 5:
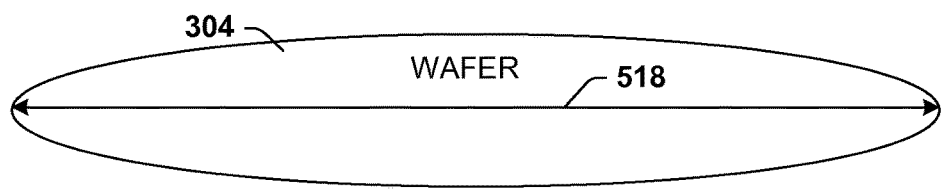

FIG. 5 is an illustration of a pumping liner 318 in accordance with some embodiments. The pumping liner 318 has an annular body, such as a hollow cylinder, disk or ring, and an array of liner apertures 306 are defined within and penetrate through the annular body. According to some embodiments, the array of liner apertures comprises at least about 60 liner apertures. According to some embodiments, respective liner apertures, within the array of liner apertures, have a radius 506 of less than about 4.5 millimeters. According to some embodiments, a sum of aperture areas of the liner apertures, within the array of liner apertures, has a cumulative aperture area of less than about 1,200 square millimeters.

According to some embodiments, the dimensions of the pumping liner 318 are selectable based on various properties of the chemical vapor deposition process. According to some embodiments, the dimensions of the pumping liner 318 are selected with respect to a size of the wafer 304, such as a wafer diameter 518 of the wafer 304. According to some embodiments, the pumping liner 318 has an inner diameter ratio of an inner diameter 502 of the annular body of the pumping liner 318 to the wafer diameter 518, where the inner diameter ratio is between about 1.15 to about 1.35. According to some embodiments, the pumping liner 318 has an outer diameter ratio of an outer diameter 504 of the annular body of the pumping liner 318 to the wafer diameter 518, where the outer diameter ratio is between about 1 to about 1.14. According to some embodiments, the annular body of the pumping liner 318 has height 512 that, when compared with the wafer diameter 518 of the wafer 304, has a height ratio between about 0.09 to about 0.2. According to some embodiments, at least one of the number, size, shape, distribution or other characteristics of the liner apertures 306 defined within and penetrating through the annular body of the pumping liner 318 vary among the array of liner apertures depending upon various factors. Accordingly, instant application, including the scope of the appended claims, is not limited to the examples provided herein. According to some embodiments, the number of liner apertures 306 is increased for larger wafers to accommodate a greater gas flow out of the deposition chamber 302 resulting from more precursor applied to interact with the larger surface area of the wafer 304.

According to some embodiments, the inner diameter 502 is between about 315 millimeters to about 355 millimeters. According to some embodiments, the outer diameter 504 is between about 360 millimeters to about 400 millimeters. According to some embodiments, the annular body of the pumping liner 318 has a thickness 510 between about 30 millimeters to about 50 millimeters. According to some embodiments, the height 512 of the annular body of the pumping liner 318 is between about 30 millimeters to about 40 millimeters. According to some embodiments, at least some of the liner apertures 306 are formed within the annular body of the pumping liner a distance 514 of between about 20 millimeters to about 23 millimeters from a top surface 516 of the annular body, as measured from a center point of the respective liner apertures.

Figure 6:
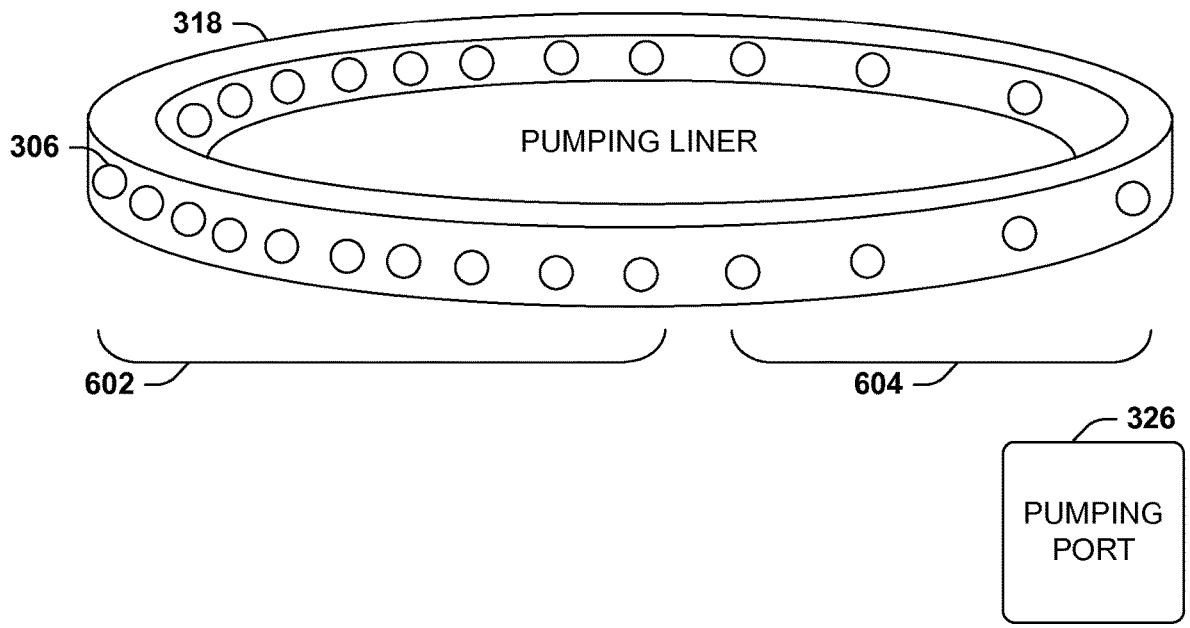
FIG. 6 is an illustration of a pumping liner having a non-uniform distribution of liner apertures, in accordance with some embodiments.

Turning to FIG. 6, liner apertures 306 are distributed non-uniformly around the pumping liner 318, according to some embodiments. According to some embodiments, the array of liner apertures comprises a first sub-array 602 of liner apertures 306 and a second sub-array 604 of liner apertures 306. According to some embodiments, the second sub-array 604 of liner apertures is nearer the pumping port 326 than the first sub-array 602 of liner apertures is to the pumping port. According to some embodiments, the first sub-array 602 has a greater density of liner apertures 306 than the second sub-array 604. According to some embodiments, the first sub-array 602 has any number of liner apertures 306, such as one or more liner apertures. According to some embodiments, the second sub-array 604 has any number of liner apertures 306, such as one or more liner apertures. According to some embodiments, a first flow rate of gas out of the deposition chamber 302 of the CVD assembly 300 through the first sub-array 602 of liner apertures is substantially equal to a second flow rate of gas out of the deposition chamber through the second sub-array 604 of liner apertures. According to some embodiments, any number of sub-arrays is contemplated, where respective sub-arrays have any number of liner apertures that are not necessary the same number from sub-array to sub-array and where substantially uniform gas flow occurs among the different sub-arrays. This substantially uniform gas flow promotes formation of a substantially uniform layer of thin film on the surface of the wafer 304.

Figure 7:
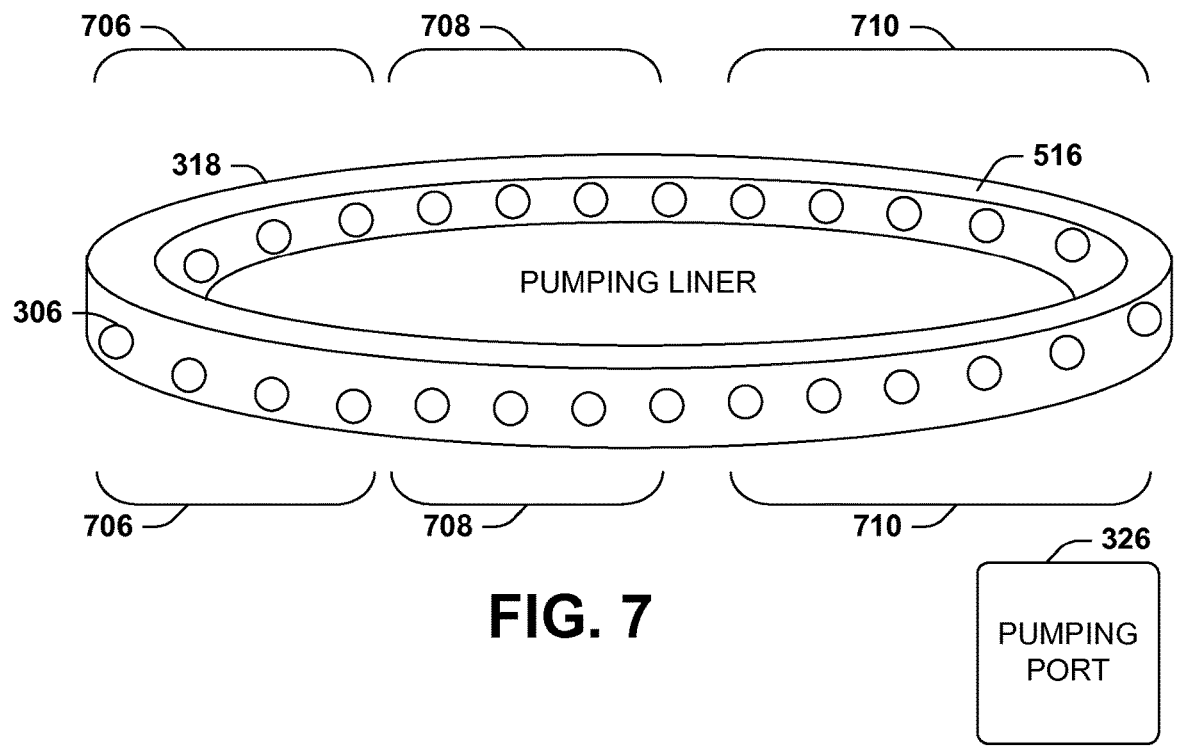
FIG. 7 is an illustration of a pumping liner having liner apertures that vary in distance from a top surface of the pumping liner, in accordance with some embodiments.

Turning to FIG. 7, liner apertures 306 vary in distance from the top surface 516 of the pumping liner 318 according to some embodiments. According to some embodiments, respective liner apertures 306 in a first group 706 of liner apertures, of the array of liner apertures, are a greater distance from the top surface 516 of the annular body of the pumping liner 318 than respective liner apertures in a second group 708 of liner apertures, of the array of liner apertures, are from the top surface 516 of the pumping liner 318, and respective liner apertures 306 in the second group 708 of liner apertures are a greater distance away from the top surface 516 of the pumping liner 318 than respective liner apertures in a third group 710 of liner apertures, of the array of liner apertures, are from the top surface 516 of the pumping liner 318. According to some embodiments, the third group 710 of liner apertures is nearer the pumping port 326 than the first group 706 of liner apertures and the second group 708 of liner apertures are to the pumping port. According to some embodiments, the first group 706, the second group 708 and the third group 710 have a different density or number of liner apertures 306 relative to one another. According to some embodiments, the first group 706 has any number of liner apertures 306, such as one or more liner apertures. According to some embodiments, the second group 708 has any number of liner apertures 306, such as one or more liner apertures. According to some embodiments, the third group 710 has any number of liner apertures 306, such as one or more liner apertures. According to some embodiments, a first flow rate of gas out of the deposition chamber 302 of the CVD assembly 300 through the first group 706 of liner apertures, a second flow rate of gas out of the deposition chamber 302 through the second group 708 of liner apertures and a third flow rate of gas out of the deposition chamber 302 through the third group 710 of liner apertures are substantially equal to one another. According to some embodiments, any number of groups is contemplated, where respective groups have any number of liner apertures that are not necessary the same number from group to group and where substantially uniform gas flow occurs among the different groups. This substantially uniform gas flow promotes formation of a substantially uniform layer of thin film on the surface of the wafer 304.

Figure 8:
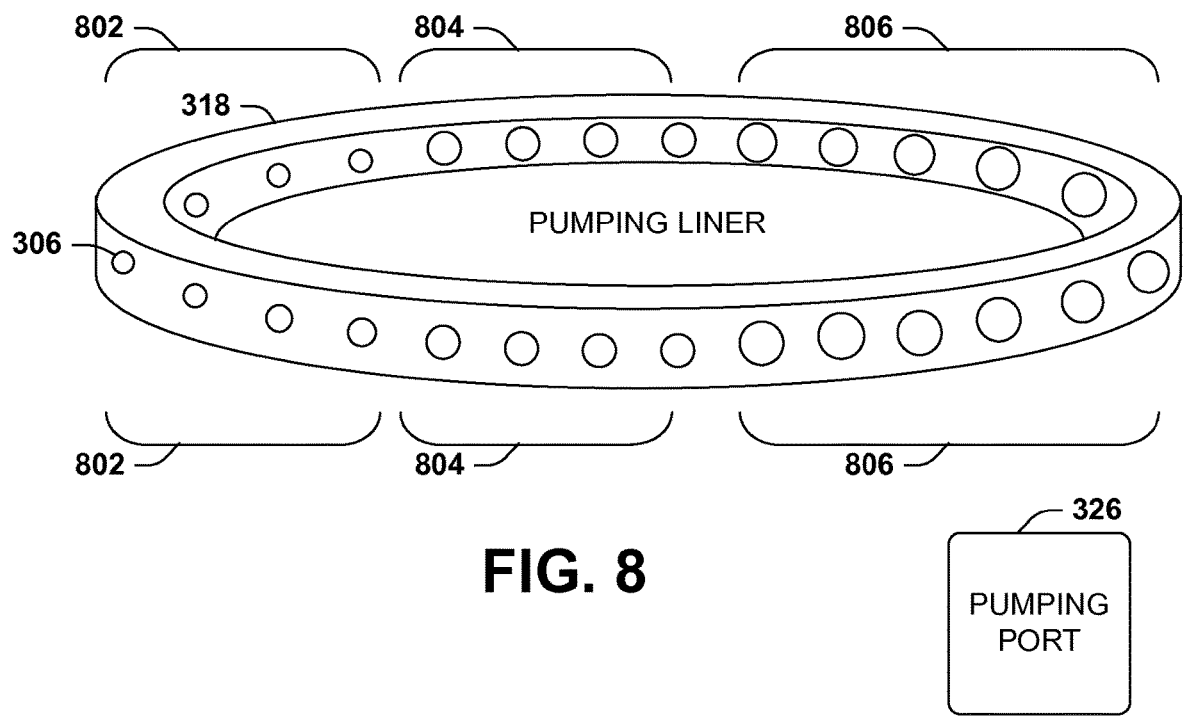
FIG. 8 is an illustration of a pumping liner having liner apertures that vary in size, in accordance with some embodiments.

Turning to FIG. 8, liner apertures 306 vary in size from one another, according to some embodiments. Although not illustrated, a liner aperture has any shape, according to some embodiments. According to some embodiments, a shape of a liner aperture differs from a shape of another liner aperture. According to some embodiments, a shape of a first liner aperture is similar to a shape of a second liner aperture but first dimensions of the first liner aperture are different than second dimensions of the second liner aperture. According to some embodiments a first liner aperture has a conical shape and a second liner aperture has the conical shape but the first conical shape is larger than the second conical shape. According to some embodiments, a cross sectional shape of a first liner aperture is circular, as illustrated, while a cross sectional shape of a second liner aperture is not circular, such as elliptical, polygonal, etc., not illustrated. As illustrated in FIG. 8, respective liner apertures 306 in a first group 802 of liner apertures, of the array of liner apertures, are smaller than respective liner apertures 306 in a second group 804 of liner apertures, of the array of liner apertures, and respective liner apertures 306 in the second group 804 of liner apertures are smaller than respective liner apertures in a third group 806 of liner apertures, of the array of liner apertures, according to some embodiments. According to some embodiments, the third group 806 of liner apertures is nearer the pumping port 326 than the first group 802 of liner apertures and the second group 804 of liner apertures are to the pumping port. According to some embodiments, the first group 802, the second group 804 and the third group 806 have a different density or number of liner apertures 306 relative to one another. According to some embodiments, the first group 802 has any number of liner apertures 306, such as one or more liner apertures. According to some embodiments, the second group 804 has any number of liner apertures 306, such as one or more liner apertures. According to some embodiments, the third group 806 has any number of liner apertures 306, such as one or more liner apertures. According to some embodiments, a first flow rate of gas out of the deposition chamber 302 of the CVD assembly 300 through the first group 802 of liner apertures, a second flow rate of gas out of the deposition chamber through the second group 804 of liner apertures and a third flow rate of gas out of the deposition chamber through the third group 806 of liner apertures are substantially equal to one another. According to some embodiments, any number of groups is contemplated, where respective groups have any number of liner apertures that are not necessary the same number from group to group and where substantially uniform gas flow occurs among the different groups. This substantially uniform gas flow promotes formation of a substantially uniform layer of thin film on the surface of the wafer 304.

According to some embodiments, a pumping liner usable in a chemical vapor deposition (CVD) assembly is provided. The pumping liner comprises an annular body and an array of liner apertures defined within and penetrating through the annular body. Respective liner apertures, of the array of liner apertures, have an aperture radius of less than about 4.5 millimeters and a sum of aperture areas of the liner apertures, of the array of liner apertures, has a cumulative aperture area of less than about 1,200 square millimeters.

According to some embodiments, chemical vapor deposition (CVD) assembly is provided. The CVD assembly comprises a wafer stage configured to place a wafer into a deposition chamber of the CVD assembly, a pumping liner encircling the deposition chamber, a pumping ring encircling the pumping liner such that a pumping passage is defined between the pumping ring and the pumping liner, and a pumping port coupled to the pumping ring. The pumping liner comprises an annular body and an array of liner apertures defined within and penetrating through the annular body, where a first liner aperture of the array of liner apertures differs from a second liner aperture of the array of liner apertures in at least one of size, shape or distance from a top surface of the annular body.

According to some embodiments, a pumping liner usable in a chemical vapor deposition (CVD) assembly comprises an annular body and an array of liner apertures defined within and penetrating through the annular body, where at least one of respective liner apertures, of the array of liner apertures, have an aperture radius of less than about 4.5 millimeters, a sum of aperture areas of the liner apertures, of the array of liner apertures, has a cumulative aperture area of less than about 1,200 square millimeters or the array of liner apertures comprises at least about 60 liner apertures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed as to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments.

As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A pumping liner usable in a chemical vapor deposition (CVD) assembly, comprising:
    an annular body; and
    an array of liner apertures defined within and penetrating radially through the annular body, wherein:
        a first liner aperture of the array of liner apertures occupies a first area of an outermost surface of the annular body,
        a second liner aperture of the array of liner apertures occupies a second area of the outermost surface of the annular body,
        the first liner aperture and the second liner aperture have a same shape,
        the second area is equal to the first area,
        the first liner aperture and the second liner aperture are on diametrically opposite sides of the annular body,
        a center of the first liner aperture is spaced a first distance from a top surface of the annular body,
        a center of the second liner aperture is spaced a second distance, different than the first distance, from the top surface of the annular body, and
        distances between the top surface of the annular body and a center of each aperture gradually increase for every liner aperture of the array of liner apertures between the first liner aperture and the second liner aperture such that, for each pair of adjacent liner apertures between the first liner aperture and the second liner aperture:
            a distance between the top surface of the annular body and a center of an aperture of the pair closest to the first liner aperture is less than a distance between the top surface of the annular body and a center of an aperture of the pair furthest from the first liner aperture.

2. The pumping liner of claim 1, wherein the array of liner apertures comprises at least 60 liner apertures.

3. The pumping liner of claim 1, wherein a ratio of a height of the annular body, measured in an axial direction of the annular body, to a wafer diameter of a wafer treated by the CVD assembly is between about 0.09 to about 0.2.

4. The pumping liner of claim 1, wherein the annular body has a thickness, measured in a radial direction of the annular body, of between about 30 millimeters to about 50 millimeters.

5. The pumping liner of claim 1, wherein liner apertures of the array of liner aperture have a non-uniform distribution around the annular body.

6. The pumping liner of claim 1, wherein a total surface area of the outermost surface that is occupied by liner apertures, including the first liner aperture and the second liner aperture, of the array of liner apertures is less than about 1,200 square millimeters.

7. The pumping liner of claim 1, wherein the top surface of the annular body is planar.

8. A pumping liner usable in a chemical vapor deposition (CVD) assembly, comprising:
- an annular body; and
- an array of liner apertures defined within and penetrating radially through the annular body, wherein:
  - a first liner aperture of the array of liner apertures and a second liner aperture of the array of liner apertures are disposed on diametrically opposite sides of the annular body,
  - the first liner aperture occupies a first area of an outermost surface of the annular body,
  - the second liner aperture occupies a second area of the outermost surface of the annular body,
  - the second area is equal to the first area,
  - a center of the first liner aperture is spaced a first distance from a top surface of the annular body,
  - a center of the second liner aperture is spaced a second distance, different than the first distance, from the top surface of the annular body, and
  - distances between the top surface of the annular body and a center of each aperture gradually increase for every liner aperture of the array of liner apertures between the first liner aperture and the second liner aperture such that, for each pair of adjacent liner apertures between the first liner aperture and the second liner aperture:
    - a distance between the top surface of the annular body and a center of an aperture of the pair closest to the first liner aperture is less than a distance between the top surface of the annular body and a center of an aperture of the pair furthest from the first liner aperture.

9. The pumping liner of claim 8, wherein the top surface of the annular body is planar.

10. The pumping liner of claim 8, wherein liner apertures of the array of liner aperture have a non-uniform distribution around the annular body.

11. The pumping liner of claim 8, wherein the first liner aperture is conically shaped.

12. A chemical vapor deposition (CVD) assembly, comprising:
- a wafer stage configured to place a wafer into a deposition chamber defined within the CVD assembly;
- a pumping liner encircling the deposition chamber;
- a pumping ring encircling the pumping liner such that a pumping passage is defined between the pumping ring and the pumping liner; and
- a pumping port coupled to the pumping ring, wherein the pumping liner comprises:
  - an annular body; and
  - an array of liner apertures defined within and penetrating radially through the annular body, wherein:
    - a center of a first liner aperture of the array of liner apertures is spaced a first distance from a top surface of the annular body,
    - a center of a second liner aperture of the array of liner apertures disposed on a diametrically opposite side of the annular body relative to the first liner aperture is spaced a second distance, different than the first distance, from the top surface of the annular body,
    - the first liner aperture occupies a first area of an outermost surface of the annular body,
    - the second liner aperture occupies a second area of the outermost surface of the annular body,
    - the second area is equal to the first area, and
    - distances between the top surface of the annular body and a center of each aperture gradually increase for every liner aperture of the array of liner apertures between the first liner aperture and the second liner aperture such that, for each pair of adjacent liner apertures between the first liner aperture and the second liner aperture:
      - a distance between the top surface of the annular body and a center of an aperture of the pair closest to the first liner aperture is less than a distance between the top surface of the annular body and a center of an aperture of the pair furthest from the first liner aperture.

13. The CVD assembly of claim 12, wherein at least one of:
- at least some liner apertures, of the array of liner apertures, have an aperture radius of less than about 4.5 millimeters, or
- a total surface area of an outermost surface of the annular body that is occupied by the liner apertures, including the first liner aperture and the second liner aperture, of the array of liner apertures is less than about 1,200 square millimeters.

14. The CVD assembly of claim 12, wherein a ratio of a height of the annular body, measured in an axial direction of the annular body, to a wafer diameter of the wafer is between about 0.09 to about 0.2.

15. The CVD assembly of claim 12, wherein the annular body has a thickness, measured in a radial direction of the annular body, of between about 30 millimeters to about 50 millimeters.

16. The CVD assembly of claim 12, wherein liner apertures of the array of liner apertures have a non-uniform distribution around the annular body.

17. The CVD assembly of claim 12, wherein the array of liner apertures comprises at least 60 liner apertures.

18. The CVD assembly of claim 12, comprising a shower head configured to introduce a precursor into the deposition chamber.

19. The pumping liner of claim 12, wherein the top surface of the annular body is planar.

20. The CVD assembly of claim 18, comprising a block plate configured to disperse the precursor prior to the precursor entering the shower head.

* * * * *